(12) United States Patent
Yang et al.

(10) Patent No.: US 11,923,032 B2
(45) Date of Patent: Mar. 5, 2024

(54) LEAKAGE DETECTION FOR THREE-DIMENSIONAL NAND MEMORY

(71) Applicant: Yangtze Memory Technologies Co., Ltd., Hubei (CN)

(72) Inventors: Kun Yang, Hubei (CN); Min She, Hubei (CN); Albert I. Ming Chang, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 193 days.

(21) Appl. No.: 17/518,284

(22) Filed: Nov. 3, 2021

(65) Prior Publication Data

US 2022/0399073 A1    Dec. 15, 2022

Related U.S. Application Data

(63) Continuation of application No. PCT/CN2021/099041, filed on Jun. 9, 2021.

(51) Int. Cl.
*G01R 31/26* (2020.01)
*G01R 19/10* (2006.01)
(Continued)

(52) U.S. Cl.
CPC ........ *G11C 29/50004* (2013.01); *G01R 19/10* (2013.01); *G11C 16/0483* (2013.01); *G11C 2029/5004* (2013.01)

(58) Field of Classification Search
CPC ............ G01R 19/10; G11C 2029/1202; G11C 2029/5004; G11C 2029/5006;
(Continued)

(56) References Cited

U.S. PATENT DOCUMENTS 5,428,621 A    6/1995  Mehrotra et al.
8,634,264 B2 *  1/2014  Yamada ............... G11C 29/025
                                                        365/201
(Continued)

OTHER PUBLICATIONS

International Search Report of the International Searching Authority directed to related International Patent Application No. PCT/CN2021/099041, dated Mar. 10, 2022; 5 pages.

*Primary Examiner* — Thang X Le
(74) *Attorney, Agent, or Firm* — Sterne, Kessler, Goldstein & Fox P.L.L.C.

(57) ABSTRACT

The present disclosure provides a circuit for detecting leakage between word lines in a memory device. The circuit includes a first and a second coupling capacitor. A first terminals of the first and second coupling capacitors are connected to a first word line and a second word line, respectively. The first terminals of the first and second coupling capacitors are also connected to a first and a second voltage supply, respectively. The circuit further includes a comparator, wherein a first input of the comparator is connected to a second terminal of the first coupling capacitor and a second input of the comparator is connected to a second terminal of the second coupling capacitor. The comparator is configured to send alarm signal when a differential voltage between the first input and the second input of the comparator is larger than a hysteresis level of the comparator.

20 Claims, 10 Drawing Sheets

(51) Int. Cl.
*G11C 29/50* (2006.01)
*G11C 16/04* (2006.01)

(58) Field of Classification Search
CPC ..... G11C 29/02; G11C 29/025; G11C 29/028; G11C 29/50; G11C 29/50004; G11C 16/0483; G11C 16/08; G11C 16/26; G11C 16/32; G11C 16/3427
See application file for complete search history.

(56) References Cited

U.S. PATENT DOCUMENTS

| | | |
|---|---|---|
| 9,903,901 B2 * | 2/2018 | Jeon ........................ G01R 31/52 |
| 2008/0062741 A1 | 3/2008 | Choi et al. |
| 2009/0063918 A1 * | 3/2009 | Chen ........................ G11C 29/02 |
| | | 714/E11.002 |
| 2016/0351274 A1 | 12/2016 | Pan et al. |
| 2019/0006020 A1 | 1/2019 | Sundaresan et al. |
| 2020/0135281 A1 | 4/2020 | Kim et al. |
| 2022/0187365 A1 * | 6/2022 | Song ........................ H01L 25/18 |

* cited by examiner

LEAKAGE DETECTION FOR THREE-DIMENSIONAL NAND MEMORY

CROSS-REFERENCE TO RELATED APPLICATIONS AND INCORPORATION BY REFERENCE

This application claims priority to PCT/CN2021/099041 filed on Jun. 9, 2021, which is incorporated herein by reference in its entirety.

TECHNICAL FIELD

The present disclosure generally relates to the field of semiconductor technology, and more particularly, to a method and a circuit for detecting word line leakage in a three-dimensional NAND flash memory.

BACKGROUND

As memory devices are shrinking to smaller die size to reduce manufacturing cost and increase storage density, scaling of planar memory cells faces challenges due to process technology limitations and reliability issues. A three-dimensional (3D) memory architecture can address the density and performance limitation in planar memory cells.

In a 3D NAND flash memory, many layers of memory cells can be stacked vertically such that storage density per unit area can be greatly increased. The vertically stacked memory cells can form memory strings, where the channels of the memory cells are connected in each memory string. Each memory cell can be addressed through a word line and a bit line. When dimensional scaling is pursued for high storage density, distance between word lines are reduced. In the meantime, word lines can be applied with different voltages during reading and programming. Voltage difference between adjacent word lines can induce leakage and thereby impact performance and reliability of the 3D NAND memory. Therefore, a need exists to detect the leakage between word lines in the 3D NAND memory.

BRIEF SUMMARY

Embodiments of methods and circuits for detecting word line leakage in a three-dimensional (3D) memory device is described in the present disclosure.

A first aspect of the present disclosure provides a circuit for detecting leakage between word lines in a memory device. The circuit includes a first coupling capacitor, wherein a first terminal of the first coupling capacitor is connected to a first word line through a first switch, and the first terminal of the first coupling capacitor is also connected to a first voltage supply through a second switch. The circuit also includes a second coupling capacitor, wherein a first terminal of the second coupling capacitor is connected to a second word line through a third switch, and the first terminal of the second coupling capacitor is also connected to a second voltage supply through a fourth switch. The circuit further includes a comparator, wherein a first input of the comparator is connected to a second terminal of the first coupling capacitor and a second input of the comparator is connected to a second terminal of the second coupling capacitor. The comparator is configured to send a signal indicating there is leakage between the first word line and the second word line when a differential voltage between the first input and the second input of the comparator is larger than a hysteresis level of the comparator.

In some embodiments, the hysteresis level of the comparator is defined by a difference between a first reference voltage and a second reference voltage of the comparator.

In some embodiments, the comparator is a hysteresis comparator.

In some embodiments, the circuit further includes a resistive voltage divider, wherein a first terminal of the resistive voltage divider is connected to the second terminal of the first coupling capacitor, and a second terminal of the resistive voltage divider is connected to the second terminal of the second coupling capacitor.

In some embodiments, the resistive voltage divider includes a first biasing resistor connected in series with a second biasing resistor.

In some embodiments, the resistive voltage divider is configured to provide a common mode reference voltage for the comparator at a connection between the first biasing resistor and the second biasing resistor.

In some embodiments, the first reference voltage of the comparator is a sum of the common mode reference voltage and a half of the hysteresis level.

In some embodiments, the second reference voltage of the comparator is a difference between the common mode reference voltage and a half of the hysteresis level.

In some embodiments, the first biasing resistor and the second biasing resistor are adjustable to a certain resistance value so as to make the differential voltage at a pre-charge stage equal to about zero, wherein, in the pre-charge stage, the second switch and the fourth switch are turned on for charging the first coupling capacitor and the second coupling capacitor.

In some embodiments, the memory device is a three-dimensional (3D) NAND Flash memory.

A second aspect of the present disclosure provides a three-dimensional (3D) memory device. The 3D memory device includes a plurality of memory cells connected to word lines and bit lines configured for addressing each of the plurality of memory cells, wherein the plurality of memory cells are vertically stacked; and a circuit for detecting leakage between word lines. The circuit includes a first coupling capacitor, wherein a first terminal of the first coupling capacitor is connected to a first word line through a first switch, and the first terminal of the first coupling capacitor is also connected to a first voltage supply through a second switch. The circuit also includes a second coupling capacitor, wherein a first terminal of the second coupling capacitor is connected to a second word line through a third switch, and the first terminal of the second coupling capacitor is connected to a second voltage supply through a fourth switch. The circuit further includes a comparator, wherein a first input of the comparator is connected to a second terminal of the first coupling capacitor and a second input of the comparator is connected to a second terminal of the second coupling capacitor, wherein the comparator is configured to send a signal indicating there is leakage between the first word line and the second word line when a differential voltage between the first input and the second input of the comparator is larger than a hysteresis level of the comparator.

A third aspect of the present disclosure provides a storage system. The storage system includes a memory controller and a three-dimensional (3D) memory device. The 3D memory device includes a plurality of memory cells connected to word lines and bit lines configured for addressing each of the plurality of memory cells, wherein the plurality of memory cells are vertically stacked. The storage system also includes a circuit for detecting leakage between word lines. The circuit includes a first coupling capacitor, wherein a first terminal of the first coupling capacitor is connected to a first word line through a first switch, and the first terminal of the first coupling capacitor is also connected to a first voltage supply through a second switch. The circuit also includes a second coupling capacitor, wherein a first terminal of the second coupling capacitor is connected to a second word line through a third switch, and the first terminal of the second coupling capacitor is connected to a second voltage supply through a fourth switch. The circuit further includes a comparator, wherein a first input of the comparator is connected to a second terminal of the first coupling capacitor and a second input of the comparator is connected to a second terminal of the second coupling capacitor. The comparator is configured to send a signal indicating there is leakage between the first word line and the second word line when a differential voltage between the first input and the second input of the comparator is larger than a hysteresis level of the comparator.

A fourth aspect of the present disclosure provides a method for detecting leakage between word lines in a memory device. The method includes pre-charging a detecting circuit and detecting a leakage between a first word line and a second word line. The pre-charging the detecting circuit includes connecting a first terminal of a first coupling capacitor in the detecting circuit to a first voltage supply; and connecting a first terminal of a second coupling capacitor in the detecting circuit to a second voltage supply. The detecting the leakage between the first word line and the second word line includes connecting the first terminal of the first coupling capacitor to the first word line; and connecting the first terminal of the second coupling capacitor to the second word line. The detecting the leakage between the first word line and the second word line further includes comparing a differential voltage at a first input and a second input of a comparator with a hysteresis level of the comparator, wherein the first input of the comparator is connected to a second terminal of the first coupling capacitor; and the second input of the comparator is connected to a second terminal of the second coupling capacitor.

In some embodiments, the method further includes sending a signal indicating leakage between the first word line and the second word line when the differential voltage is larger than a hysteresis level of the comparator.

In some embodiments, the pre-charging the detecting circuit further includes disconnecting the first terminal of the first coupling capacitor from the first word line; and disconnecting the first terminal of the second coupling capacitor from the second word line.

In some embodiments, the detecting the leakage between the first word line and the second word line further includes disconnecting the first terminal of the first coupling capacitor from the first voltage supply; and disconnecting the first terminal of the second coupling capacitor from the second voltage supply.

In some embodiments, the method further includes setting a common mode reference voltage of the comparator using a resistive voltage divider, wherein a first terminal of the resistive voltage divider is connected to the first input of comparator; a second terminal of the resistive voltage divider is connected to the second input of the comparator; and the resistive voltage divider comprises a first biasing resistor connected in series with a second biasing resistor.

In some embodiments, the method further includes setting a first reference voltage and a second reference voltage for the comparator, wherein the first reference voltage is a sum of the common mode reference voltage and a half of the hysteresis level; and the second reference voltage is a difference between the common mode reference voltage and the half of the hysteresis level.

In some embodiments, the method further includes adjusting the first biasing resistor and/or the second biasing resistor to a certain resistance value so as to make the differential voltage at a pre-charge stage equal to about zero, wherein, in the pre-charge stage, the second switch and the fourth switch are turned on for charging the first coupling capacitor and the second coupling capacitor.

In some embodiments, the method further includes sending a signal indicating that there is no leakage between the first word line and the second word line when the differential voltage remains smaller than the hysteresis level of the comparator.

In some embodiments, the detecting leakage between word lines in the memory device includes detecting leakage between word lines in a 3D NAND flash memory.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
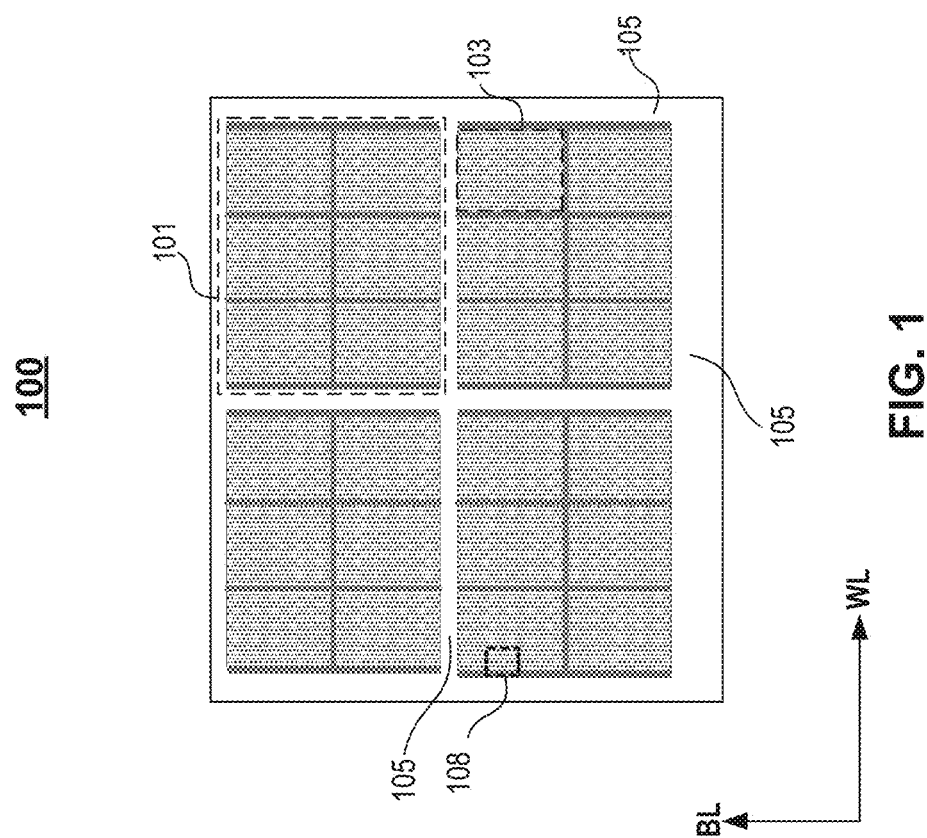
FIG. 1 illustrates a schematic top-down view of an exemplary three-dimensional (3D) memory die, according to some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer there between. Moreover, "above" or "over" not only means "above" or "over" something, but can also include the meaning it is "above" or "over" something with no intermediate feature or layer there between (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, there above, and/or there below. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

FIG. 1 illustrates a top-down view of an exemplary three-dimensional (3D) memory device 100, according to some embodiments of the present disclosure. The 3D memory device 100, such as 3D NAND Flash memory, can be a memory chip (package), a memory die or any portion of a memory die, and can include one or more memory planes 101, each of which can include a plurality of memory blocks 103. Identical and concurrent operations can take place at each memory plane 101. The memory block 103, which can be megabytes (MB) in size, is the smallest size to carry out erase operations. Shown in FIG. 1, the exemplary 3D memory device 100 includes four memory planes 101 and each memory plane 101 includes six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 1. In this disclosure, memory block 103 is also referred to as a "memory array" or "array." The memory array is the core area in a memory device, performing storage functions.

The 3D memory device 100 also includes a periphery region 105, an area surrounding memory planes 101. The periphery region 105 contains many digital, analog, and/or mixed-signal circuits to support functions of the memory array, for example, page buffers, row and column decoders and sense amplifiers. Peripheral circuits use active and/or passive semiconductor devices, such as transistors, diodes, capacitors, resistors, etc., as would be apparent to a person of ordinary skill in the art.

It is noted that, the arrangement of the memory planes 101 in the 3D memory device 100 and the arrangement of the memory blocks 103 in each memory plane 101 illustrated in FIG. 1 are only used as an example, which does not limit the scope of the present disclosure.

Figure 2:
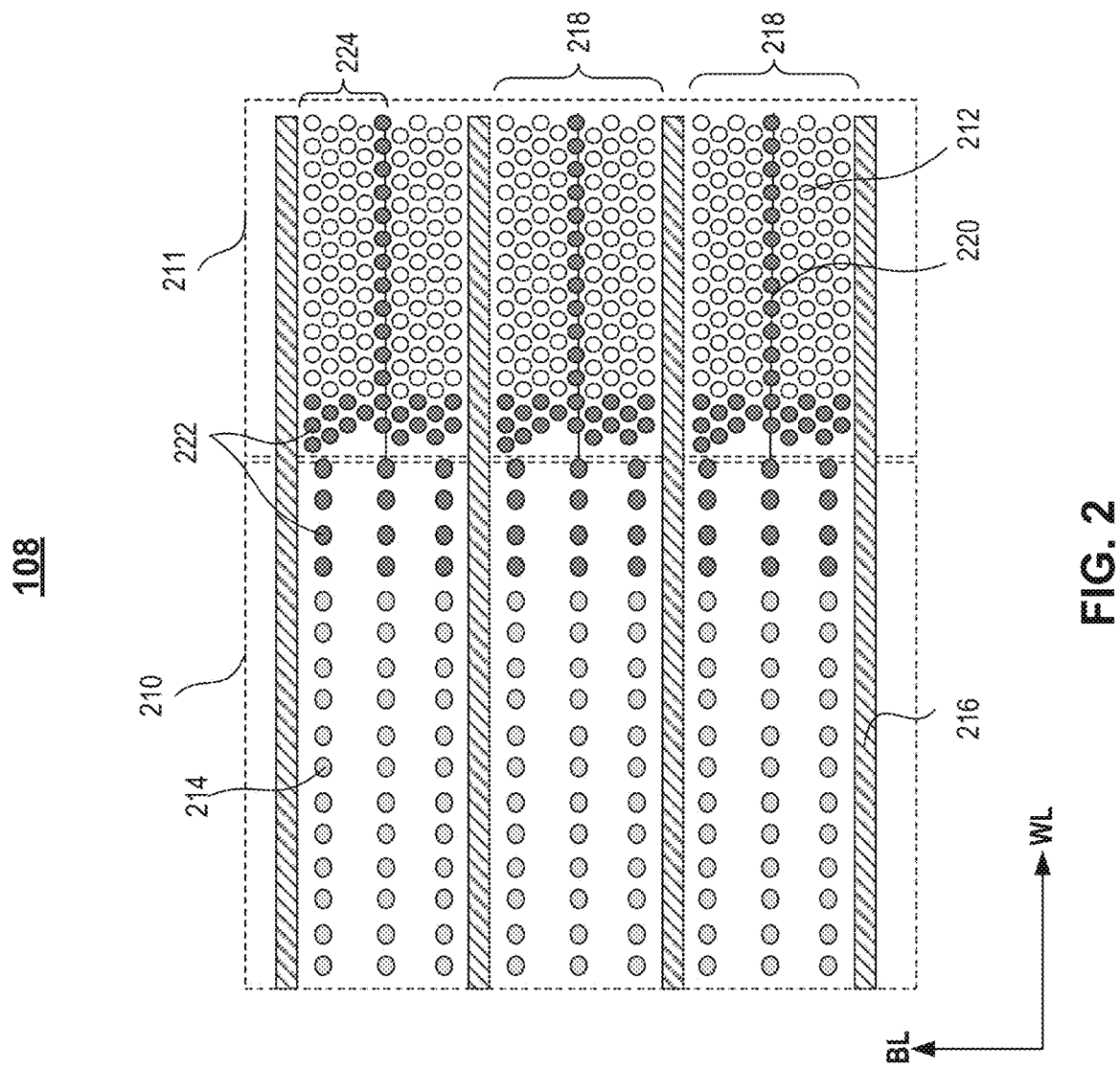
FIG. 2 illustrates a schematic top-down view of a region of 3D memory die, according to some embodiments of the present disclosure.

Referring to FIG. 2, an enlarged top-down view of a region 108 in FIG. 1 is illustrated, according to some embodiments of the present disclosure. The region 108 of the 3D memory device 100 can include a staircase region 210 and a channel structure region 211. The channel structure region 211 can include an array of memory strings 212, each including a plurality of stacked memory cells. The staircase region 210 can include a staircase structure and an array of contact structures 214 formed on the staircase structure. In some embodiments, a plurality of slit structures 216, extending in WL direction across the channel structure region 211 and the staircase region 210, can divide a memory block into multiple memory fingers 218. At least some slit structures 216 can function as the common source contact (e.g., array common source) for an array of memory strings 212 in channel structure regions 211. A top select gate cut 220 can be disposed, for example, in the middle of each memory finger 218 to divide a top select gate (TSG) of the memory finger 218 into two portions, and thereby can divide a memory finger into two memory slices 224, where memory cells in a memory slice 224 that share the same word line form a programmable (read/write) memory page. While erase operation of a 3D NAND memory can be carried out at memory block level, read and write operations can be carried out at memory page level. A memory page can be kilobytes (KB) in size. In some embodiments, region 108 also includes dummy memory strings 222 for process variation control during fabrication and/or for additional mechanical support.

Figure 3:
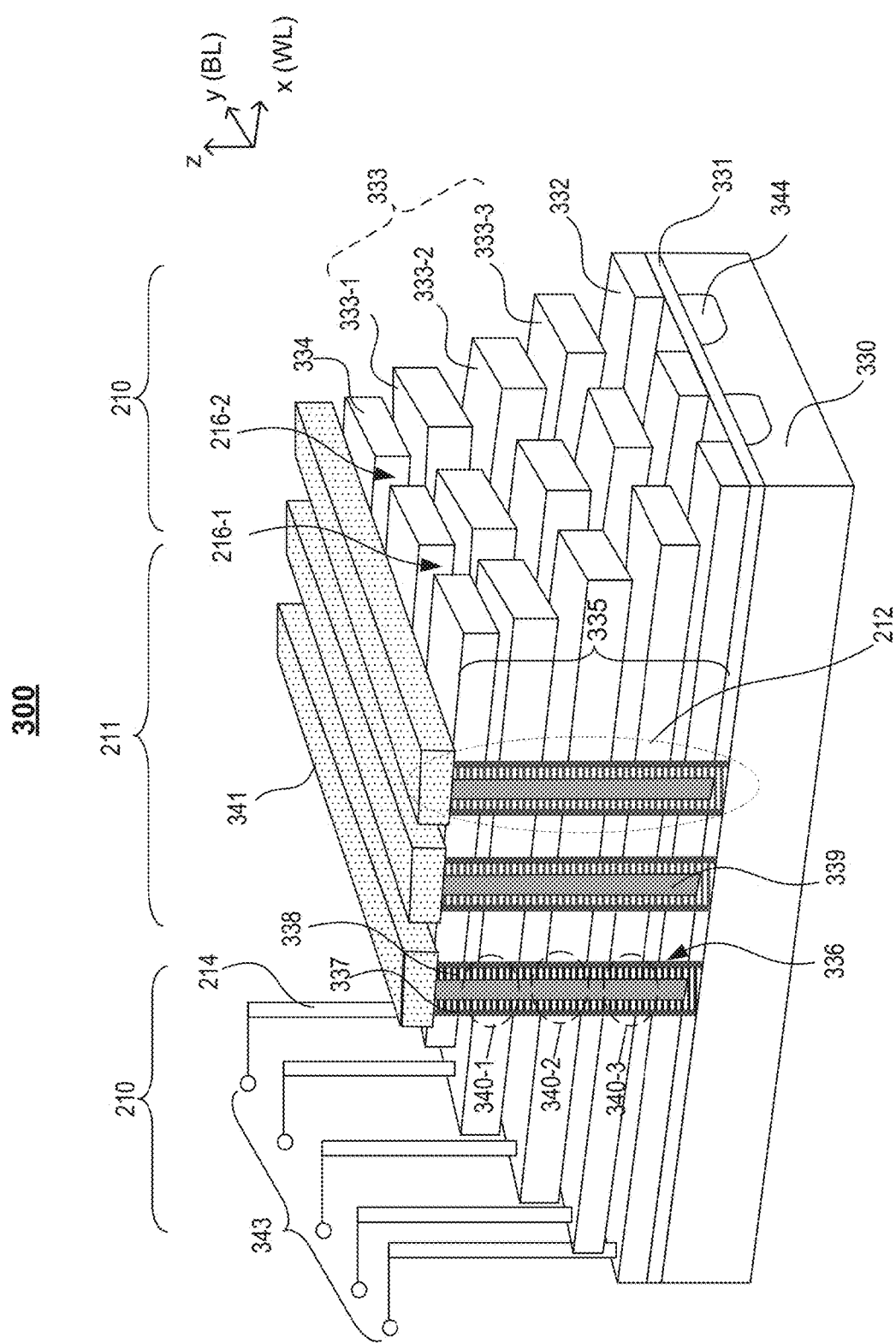
FIG. 3 illustrates a perspective view of a portion of an exemplary 3D memory array structure, in accordance with some embodiments of the present disclosure.

FIG. 3 illustrates a perspective view of a portion of an exemplary three-dimensional (3D) memory array structure 300, according to some embodiments of the present disclosure. The memory array structure 300 includes a substrate 330, an insulating film 331 over the substrate 330, a tier of lower select gates (LSGs) 332 over the insulating film 331, and a plurality of tiers of control gates 333, also referred to as "word lines (WLs)," stacking on top of the LSGs 332 to form a film stack 335 of alternating conductive and dielectric layers. The dielectric layers adjacent to the tiers of control gates are not shown in FIG. 3 for clarity.

The control gates of each tier are separated by slit structures 216-1 and 216-2 through the film stack 335. The memory array structure 300 also includes a tier of top select gates (TSGs) 334 over the stack of control gates 333. The stack of TSG 334, control gates 333 and LSG 332 is also referred to as "gate electrodes". The memory array structure 300 further includes memory strings 212 and doped source line regions 344 in portions of substrate 330 between adjacent LSGs 332. Each memory strings 212 includes a channel hole 336 extending through the insulating film 331 and the film stack 335 of alternating conductive and dielectric layers. Memory strings 212 also includes a memory film 337 on a sidewall of the channel hole 336, a channel layer 338 over the memory film 337, and a core filling film 339 surrounded by the channel layer 338. A memory cell 340 (e.g., 340-1, 340-2, 340-3) can be formed at the intersection of the control gate 333 (e.g., 333-1, 333-2, 333-3) and the memory string 212. A portion of the channel layer 338 responds to the respective control gate is also referred to as the channel 338 of the memory cell. The memory array structure 300 further includes a plurality of bit lines (BLs) 341 connected with the memory strings 212 over the TSGs 334. The memory array structure 300 also includes a plurality of metal interconnect lines 343 connected with the gate electrodes through a plurality of contact structures 214. The edge of the film stack 335 is configured in a shape of staircase to allow an electrical connection to each tier of the gate electrodes.

In FIG. 3, for illustrative purposes, three tiers of control gates 333-1, 333-2, and 333-3 are shown together with one tier of TSG 334 and one tier of LSG 332. In this example, each memory string 212 can include three memory cells 340-1, 340-2 and 340-3, corresponding to the control gates 333-1, 333-2 and 333-3, respectively. In some embodiments, the number of control gates and the number of memory cells can be more than three to increase storage capacity. The memory array structure 300 can also include other structures, for example, TSG cut, common source contact (i.e., array common source) and dummy memory string. These structures are not shown in FIG. 3 for simplicity.

Figure 4:
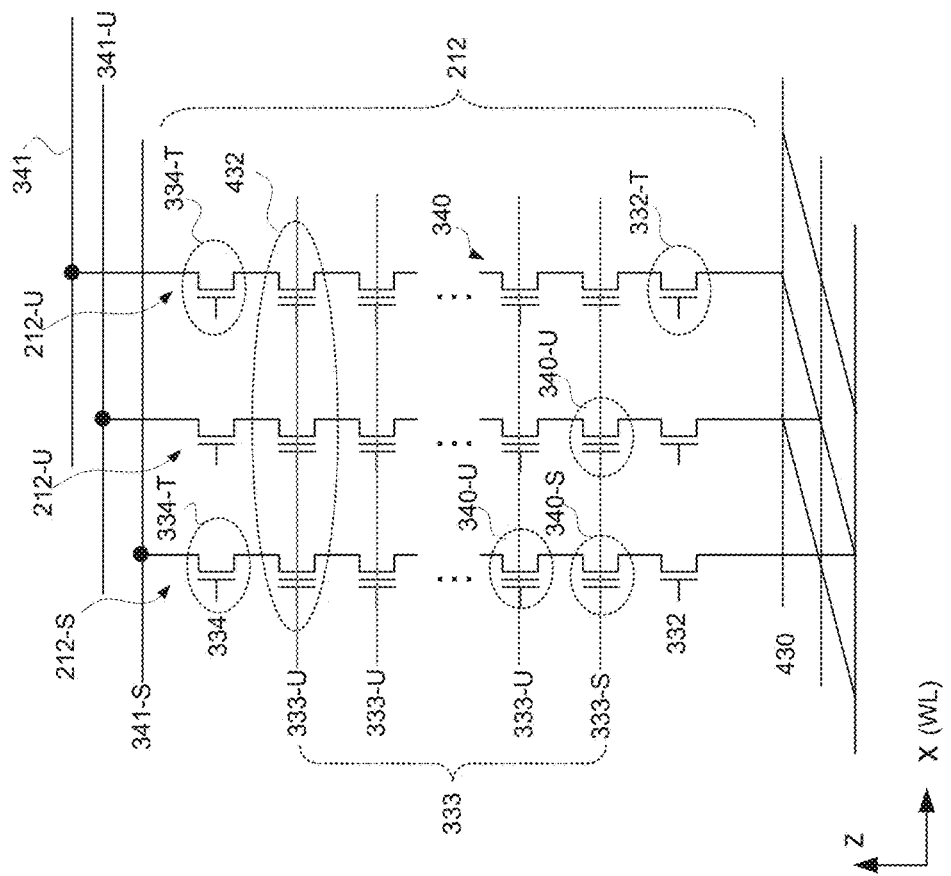
FIG. 4 illustrates a schematic circuit diagram of a 3D memory device, according to some embodiments of the present disclosure.

FIG. 4 shows a schematic circuit diagram of the memory block 103 (also referred to as memory array 103), according to some embodiments of the present disclosure. The memory array 103 includes a plurality of memory strings 212, each memory string 212 having a plurality of memory cells 340. The memory string 212 also includes at least one field effect transistor (e.g., MOSFET) at each end, which is controlled by a lower select gate (LSG) 332 and a top select gate (TSG) 334, respectively. And the two respective transistors are referred to as lower and top select transistors 332-T and 334-T. The memory cell 340 can be controlled by the control gate 333, where some control gates 333 can be electrically connected to the same word line of the memory array 103. Thus, for simplicity, the control gates and their corresponding word lines are used exchangeably in the present disclosure. The drain terminal of the top select transistor 334-T can be connected to the bit line 341, and the source terminal of the lower select transistor 332-T can be connected to an array common source (ACS) 430. The ACS 430 can be shared by the memory strings 212 in an entire memory block, and is also referred to as the common source line.

In some embodiments, the memory array 103 can be formed based on floating gate technology. In some embodiments, the memory array 103 can be formed based on charge trapping technology. The NAND flash memory based on charge trapping can provide high storage density and high intrinsic reliability. Storage data or logic states ("states," e.g., threshold voltages $V_{th}$ of the memory cell 340) depends on the number of charge carriers trapped in the memory film 337 of the memory cell 340.

In a NAND flash memory, a read operation and a write operation (also referred to as program operation) can be performed for a memory page 432, which includes all memory cells 340 sharing the same word line, and an erase operation can be performed for the memory block 103.

In a NAND memory, the memory cell 340 can be in an erased state ER or a programmed state P1. Initially, the memory cells 340 in the memory array 103 can be reset to the erased state ER as logic "1" by implementing a negative voltage difference between the control gates 333 and the channel 338 such that trapped charge carriers in the storage layer of the memory cells 340 can be removed. For example, the negative voltage difference can be induced by setting the control gates 333 of the memory cells 340 to ground, and applying a high positive voltage (an erase voltage $V_{erase}$) to the ACS 430. At the erased state ER ("state ER"), the threshold voltage $V_{th}$ of the memory cells 340 can be reset to the lowest value.

During programming (i.e., writing), a positive voltage difference between the control gates 333 and the channel 338 can be established by, for example, applying a program voltage $V_{pgm}$ (e.g., a positive voltage pulse between 10 V and 20 V) on the control gate 333, and grounding the corresponding bit line 341. As a result, charge carriers (e.g., electrons) can be injected into the storage layer of the memory cell 340, thereby increasing the threshold voltage $V_{th}$ of the memory cell 340. Accordingly, the memory cell 340 can be programmed to the programmed state P1 ("state P1").

The state of the memory cell (e.g., state ER or state P1) can be determined by measuring or sensing the threshold voltage $V_{th}$ of the memory cell. During a read operation, a read voltage $V_{read}$ can be applied on the control gate 333 of the memory cell and current flowing through the memory cell can be measured at the bit line 341. A pass voltage $V_{pass}$ can be applied on unselected word lines to switch on unselected memory cells.

A NAND flash memory can be configured to operate in a single-level cell (SLC) mode. To increase storage capacity, a NAND flash memory can also be configured to operate in a multi-level cell (MLC) mode, a triple-level cell (TLC) mode, a quad-level cell (QLC) mode, or a combination of any of these modes. In the SLC mode, a memory cell stores 1 bit and has two logic states ("states"), i.e., states ER and P1. In the MLC mode, a memory cell stores 2 bits, and has four states, i.e., states ER, P1, P2, and P3. In the TLC mode, a memory cell stores 3 bits, and has eight states, i.e., states ER, and states P1-P7. In the QLC mode, a memory cell stores 4 bits and has 16 states.

When the program voltage $V_{pgm}$ is applied on a selected WL 333-S, a selected memory cell 340-S on a selected memory string 212-S can be programmed to a logic state (e.g., state P1). To achieve this, a selected bit line 341-S that is connected to the selected memory string 212-S can be grounded and the top select transistor 334-T on the selected memory string 212-S can be switched on. The pass voltage $V_{pass}$ can be applied on unselected WLs 333-U to switch on unselected memory cells 340-U. In some embodiments, the pass voltage $V_{pass}$ can be in a range between 6 V and 13 V. The unselected memory cell 340-U on the selected memory string 212-S can be switched on when the pass voltage $V_{pass}$ is higher than the threshold voltage $V_{th}$ of the unselected memory cell 340-U. As such, the channel 338 of the selected memory string 212-S can be tied to ground through the selected bit line 341-S. When the program voltage $V_{pgm}$ is applied on the selected WL 333-S, the large potential difference between the control gate 333 and the channel 338 results in tunneling of charge carriers (i.e., electrons) into the memory film 337. By adjusting the program voltage $V_{pgm}$, the number of charge carriers stored in the memory film 337 can be adjusted. And the threshold voltage $V_{th}$ of the selected memory cell 340-S can be adjusted accordingly. As such, the selected memory cell 340-S can be programmed to a target state.

As described above, two adjacent word lines can be applied with different voltages during reading or programming. Thus, leakage can take place between two adjacent word lines due to the voltage difference, which can negatively impact the performance and data retention of the 3D memory device. Various techniques have been implemented to detect the leakage between two word lines in a 3D NAND flash memory. For example, by using a single-ended circuit, a voltage drop on the word line caused by leakage, can be directly compared with a reference voltage at a comparator. When the leakage between two word lines is larger than a predetermined value, the comparator can send an indicating signal. However, common mode noise exists even when leakage current is zero, which can produce false alarms. Also capacitive couplings or feedthrough from switches can induce inaccurate measurement. The present disclosure provides a method and a circuit for detecting the leakage between two word lines through a differential voltage change. As such, more accurate measurement can be performed with less circuit elements.

Figure 5:
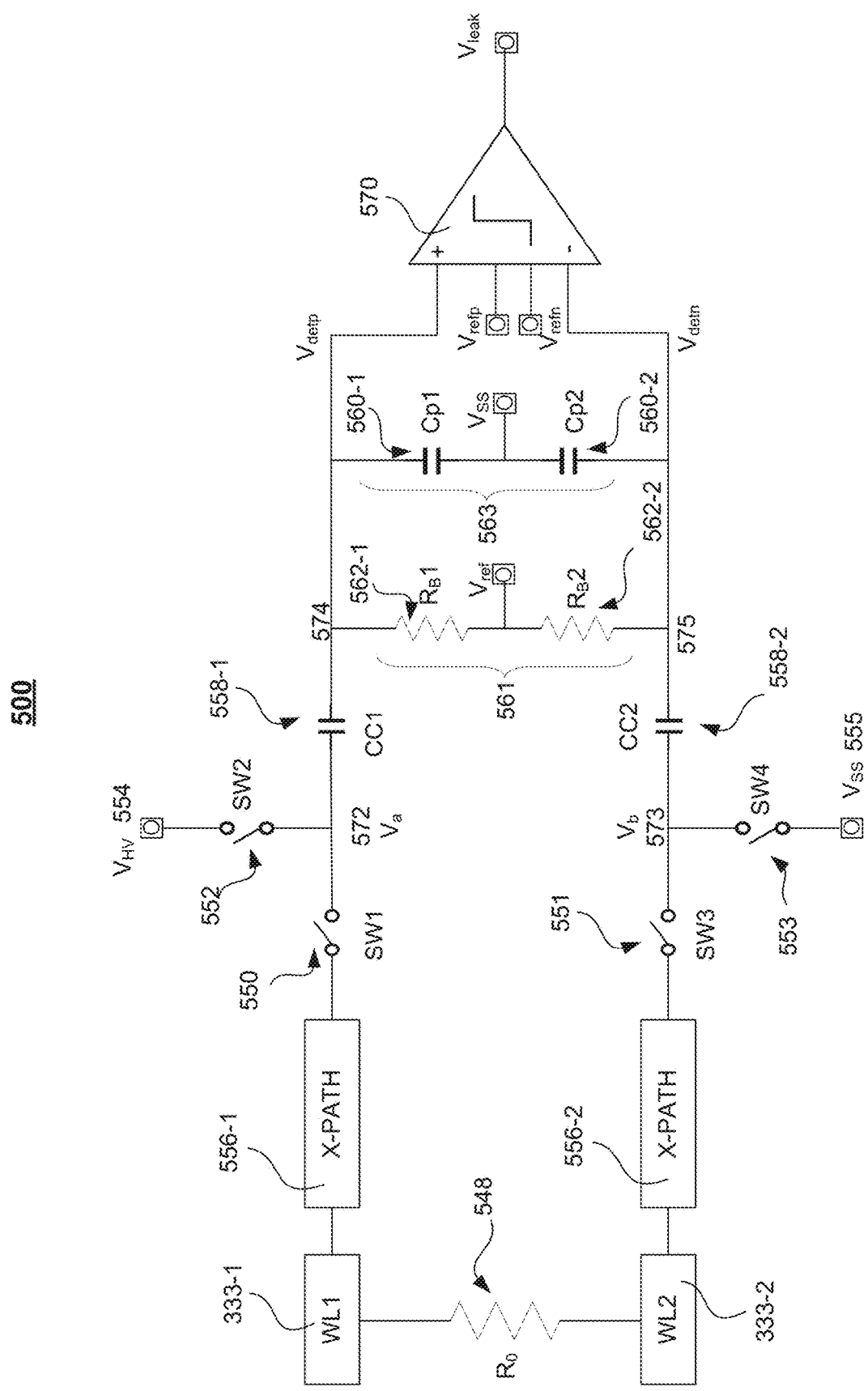
FIG. 5 illustrates a schematic circuit diagram of a detecting circuit, according to some embodiments of the present disclosure.

FIG. 5 illustrates a circuit 500 for detecting leakage between two word lines, according to some embodiments of the present disclosure. In this example, a first word line (WL1) 333-1 and a second word line (WL2) 333-2 can be any word lines 333 that address the memory cells 340 in a 3D NAND Flash memory as shown in FIGS. 1-4. A leakage current between the WL1 and WL2 can be represented by a simulated resistor 548 with a resistance $R_O$, where a larger resistance $R_O$ represents a smaller leakage current and a smaller resistance $R_O$ represents as larger leakage current.

The detecting circuit 500 includes a first switch (SW1) 550 and a third switch (SW3) 551, electrically connected to WL1 333-1 and WL2 333-2, respectively. The detecting circuit 500 also includes a second switch (SW2) 552 and a fourth switch SW4 553, electrically connected to a first voltage supply 554 and a second voltage supply 555, respectively. The SW1 550, SW2 552, SW3 551 and SW4 553 can include any electronic switches, for example, any suitable diodes and transistors, such as bipolar transistors (BJTs), metal oxide semiconductor field effect transistors (MOSFETs), junction field effect transistors (JFETs), etc.), or any combination thereof. In some embodiments, the SW1 550, SW2 552, SW3 551 and SW4 553 can also include any suitable electromechanical switches, for example, relays, actuators, toggle switches, push-button switches, etc.

In some embodiments, the first voltage supply 554 can provide a first supply voltage ($V_{HV}$) higher than a second supply voltage ($V_{SS}$) provided by the second voltage supply 555. For example, $V_{HV}$ can be 12 V and $V_{SS}$ can be 1.2 V. The detecting circuit 500 can also include more switches and electric elements between WL1 333-1 and SW1 550, which can be represented as an element X-PATH 556-1. Similarly, additional switches and electric elements between WL2 333-2 and SW3 551 can also be represented as another element X-PATH 556-2.

The detecting circuit 500 also includes a first coupling capacitor (CC1) 558-1 and a second coupling capacitor (CC2) 558-2. A first terminal 572 of CC1 558-1 can be connected to WL1 333-1 through SW1 550, and a first terminal 573 of CC2 558-2 can be connected to WL2 333-2 through SW3 551. The first terminal 572 of CC1 558-1 can also be connected to the first voltage supply 554 through SW2 552, and the first terminal 573 of CC2 558-2 can also be connected to the second voltage supply 555 through SW4 553. The first terminal 572 of CC1 558-1 can have an electric potential $V_a$ and the first terminal 573 of CC2 558-2 can have an electric potential $V_b$.

The detecting circuit 500 further includes a comparator 570, with a first input (e.g., the positive input) connected to a second terminal 574 of CC1 558-1 and a second input (e.g., the negative input) connected to a second terminal 575 of CC2 558-2. In some embodiments, the comparator 570 can include one or more functional amplifiers (e.g., differential amplifiers) or circuits designed to compare input signals with reference signals. In some embodiments, the comparator 570 can include a window comparator, and is also referred to as "hysteresis comparator". In some embodiments, the comparator 570 can be configured to amplify a first difference voltage between two input signals and compare the first difference voltage with a second difference voltage, where the second difference voltage can be set from two reference voltages.

In some embodiments, the first input of the comparator 570 can have a first detecting voltage $V_{detp}$ and the second input can have a second detecting voltage $V_{detn}$. A differential voltage $\Delta V$ of the detecting circuit 500 can be defined as a voltage difference between the first detecting voltage $V_{detp}$ and the second detecting voltage $V_{detn}$, i.e., $\Delta V = V_{detp} - V_{detn}$. In some embodiments, the comparator 570 can have a first reference voltage $V_{refp}$ and a second reference voltage $V_{refn}$, where the first reference voltage $V_{refp}$ can be larger than the second reference voltage $V_{refn}$. A hysteresis level $V_{hys}$ of the comparator 570 can be defined as a voltage difference between the first reference voltage $V_{refp}$ and the second reference voltage $V_{refn}$, i.e., $V_{hys} = V_{refp} - V_{refn}$. The first reference voltage $V_{refp}$ and the second reference voltage $V_{refn}$ of the comparator 570 can be designed such that a predetermined hysteresis level $V_{hys}$ can be provided to compare with the differential voltage $\Delta V$. In some embodiments, when the differential voltage $\Delta V = V_{detp} - V_{detn}$ is larger than the hysteresis level $V_{hys} = V_{refp} - V_{refn}$, the comparator 570 can send an alarm signal $V_{leak}$, indicating that there is a leakage between WL1 333-1 and WL2 333-2. In some embodiments, when the differential voltage $\Delta V = V_{detp} - V_{detn}$ remains smaller than the hysteresis level $V_{hys} = V_{refp} - V_{refn}$, the comparator 570 can send a signal indicating that there is no leakage between WL1 333-1 and WL2 333-2.

The detecting circuit 500 can also include a resistive voltage divider 561. A first terminal of the resistive voltage divider 561 can be connected to the second terminal 574 of CC1 558-1 and the first input of the comparator 570. A second terminal of the resistive voltage divider 561 can be connected to the second terminal 575 of CC2 558-2 and the second input of the comparator 570. The resistive voltage divider 561 can include a first biasing resistor (RB1) 562-1 connected in series with a second biasing resistor RB2 562-2, where an electric potential at a connection between RB1 562-1 and RB2 562-2 provides a common mode reference voltage $V_{ref}$ for the comparator 570.

In some embodiments, parasitic capacitances of the detecting circuit 500 can be simulated by a capacitive voltage divider 563. A first terminal of the capacitive voltage divider 563 is connected to the second terminal 574 of CC1 558-1 and the first input of the comparator 570. A second terminal of the capacitive voltage divider 563 can be connected to the second terminal 575 of CC2 558-2 and the second input of the comparator 570. The capacitive voltage divider 563 includes a first parasitic capacitance (Cp1) 560-1 connected in series with a second parasitic capacitance (Cp2) 560-2, where an electric potential at a connection between Cp1 560-1 and Cp2 560-2 can be equivalent to the low supply voltage $V_{SS}$. In this example, the capacitive voltage divider 563 is connected in parallel with the resistive voltage divider 561.

In some embodiments, the first supply voltage $V_{HV}$ and the second supply voltage $V_{SS}$, the first and second coupling capacitors CC1 558-1 and CC2 558-2, and the first and second biasing resistors RB1 562-1 and RB2 562-2 can be adjusted independently to obtain the common mode reference voltage $V_{ref}$.

By comparing the differential voltage $\Delta V = V_{detp} - V_{detn}$ with the hysteresis level $V_{hys}$, changes common to the first input and the second input of the comparator 570 (i.e., common-mode input change) can be filtered out. The detecting circuit 500 can be configured to mostly respond to the difference of the first input and the second input of the comparator 570 (i.e., normal-mode input change).

Figure 6:
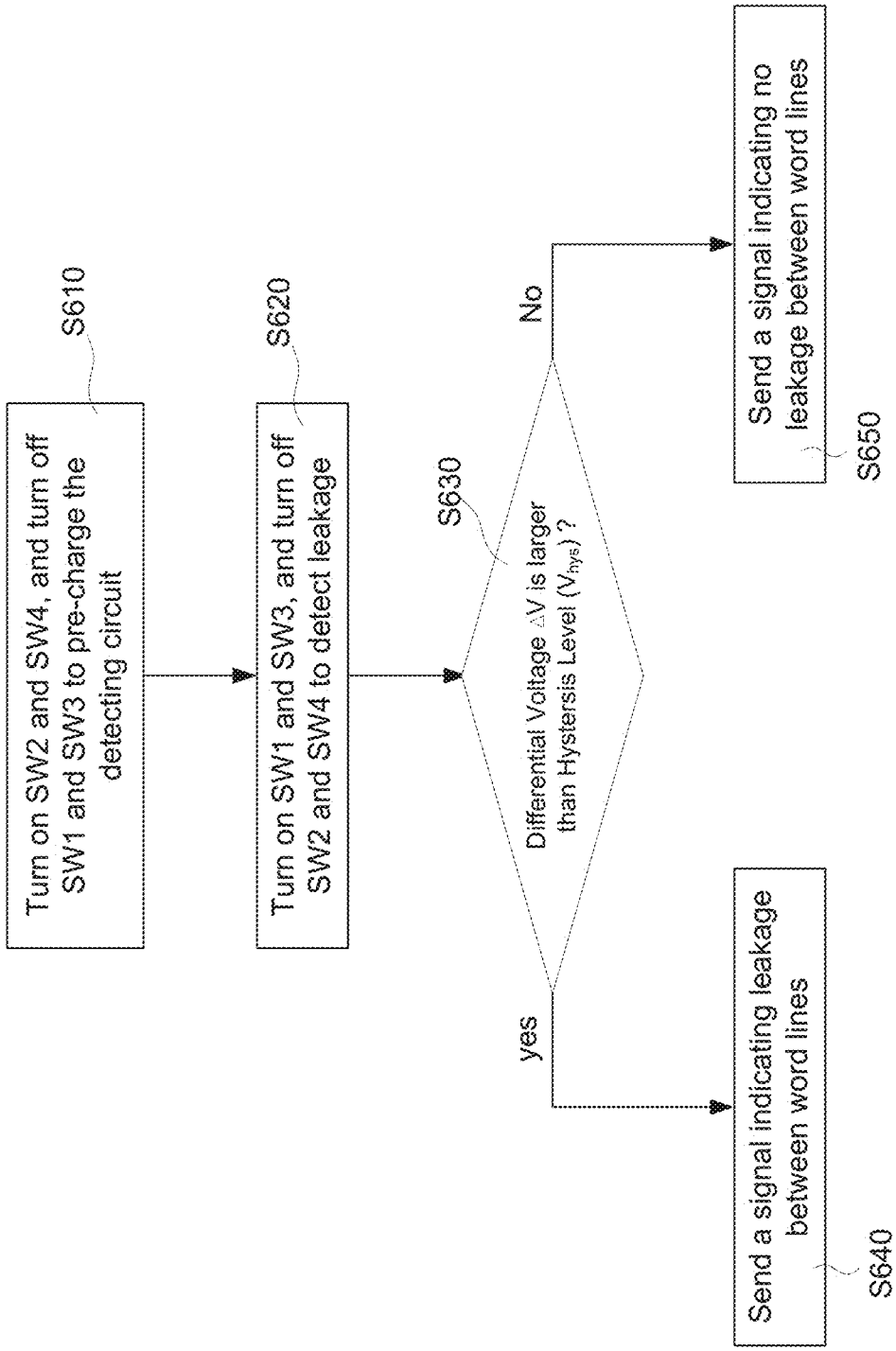
FIG. 6 illustrates a flow diagram of a method for detecting leakage between word lines in a memory device, according to some embodiments of the present disclosure.

FIG. 6 illustrates a method 600 for detecting leakage between word lines in a 3D NAND flash memory, according to some embodiments of the present disclosure. It should be understood that the steps shown in method 600 are not exhaustive and that other steps can be performed as well before, after, or between any of the illustrated steps. In some embodiments, some steps of method 600 can be omitted or include other steps that are not described here for simplicity. In some embodiments, steps of method 600 can be performed in a different order and/or vary.

The method 600 includes two stages: a pre-change stage and a detecting stage. At step S610, the pre-charge stage can be started by turning on the second switch (SW2) 552 and the fourth switch 553 of the detecting circuit 500 (shown in FIG. 5). In the meantime, the first switch (SW1) 550 and the third switch 551 can be turned off. At the pre-charge stage, the first and second word lines WL1 333-1 and WL2 333-2 are disconnected from the other electric elements of the detecting circuit 500 (e.g., the first and second coupling capacitors CC1 558-1 and CC2 558-2, and the comparator 570), such that the first and second detecting voltages $V_{detp}$ and $V_{detn}$ can be initialized independent of any leakage between the WL1 333-1 and WL2 333-2.

Figure 7:
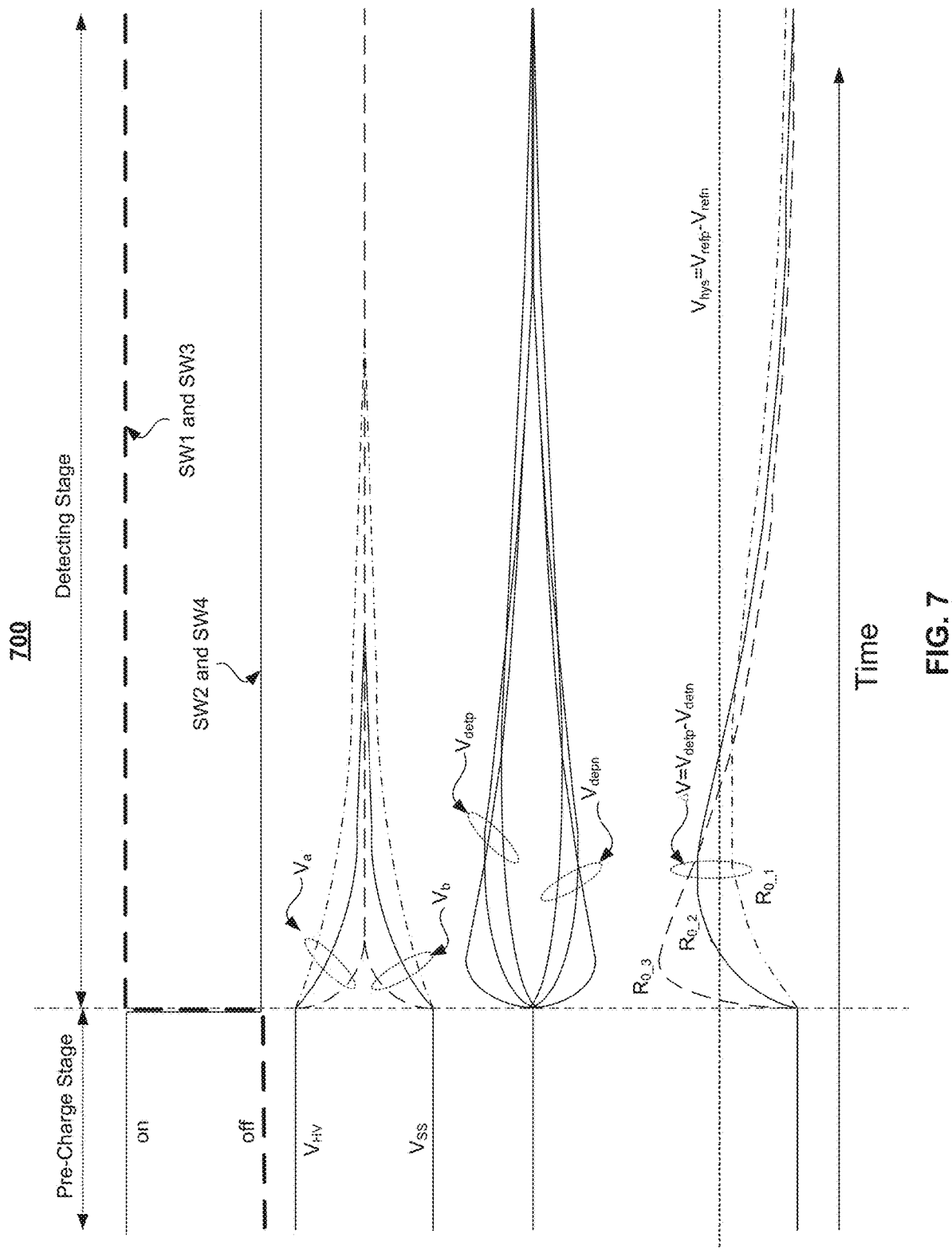
FIG. 7 illustrates timing diagrams of various electric elements of a detecting circuit, according to some embodiments of the present disclosure.

FIG. 7 illustrates timing diagrams of various elements of the detecting circuit 500, according to some embodiments of the present disclosure. At step S610, SW1 and SW3 (dashed lines) are turned off, and SW2 and SW4 (solid lines) are turned on. As a result, the electric potential $V_a$ at the first terminal 572 of CC1 558-1 can be held at the first supply voltage $V_{HV}$. And the electric potential $V_b$ at the first terminal 573 of CC2 558-2 can be held at the second supply voltages $V_{SS}$. During the pre-charge stage, CC1 558-1 and CC2 558-2 can be pre-charged through the first supply voltage $V_{HV}$ and the second supply voltage $V_{SS}$, respectively. After a sufficient long time, the detecting circuit 500 can reach a steady state, i.e., a common mode, where the first detecting voltage $V_{detp}$ equals the second detecting voltage $V_{detn}$. Therefore, the differential voltage $\Delta V$ is zero.

In some embodiments, due to common mode noises, for example, additional parasitic resistance or capacitance associated with one of the word lines, the differential voltage $\Delta V$ at the pre-charge stage can have a non-zero value. By regulating CC1 558-1 and CC2 558-2, and/or RB1 562-1 and RB2 562-2, the differential voltage $\Delta V$ can be adjusted to zero. In the other words, the first coupling capacitor CC1 558-1, the second coupling capacitor CC2 558-2, the first biasing resistor RB1 562-1 and the second biasing resistor RB2 562-2 can be adjusted to minimize/decrease common mode noises.

Referring back to FIG. 6, at step S620, SW1 550 and SW3 551 can be turned on, and SW2 552 and SW4 553 can be turned off. The detecting circuit 500 can be connected to WL1 333-1 and WL2 333-2. As such, the detecting stage is started. In some embodiments, CC1 558-1, CC2 558-2, Cp1 560-1 and Cp2 560-2 can be discharged through leakage current between WL1 333-1 and WL 333-2.

The switching behavior of SW1-SW4 is shown in FIG. 7. If there is leakage between WL1 333-1 and WL2 333-2, the electric potential $V_a$ at the first terminal 572 of CC1 558-1 drops, and the electric potential $V_b$ at the first terminal 573 of CC2 558-2 rises. After a sufficient long time when CC1 558-1, CC2 558-2, Cp1 560-1 and Cp2 560-2 have been completed discharged, the electric potentials $V_a$ and $V_b$ can remain at the same voltage.

In the meantime, the first detecting voltage $V_{detp}$ at the first input of the comparator 570 can increase at the beginning of the detecting stage and then decrease gradually. The second detecting voltage $V_{detn}$ at the second input of the comparator 570 can decrease at the beginning of the detecting stage and then increase gradually. After a sufficient long time when CC1 558-1, CC2 558-2, Cp1 560-1 and Cp2 560-2 have been completed discharged, the first detecting voltage $V_{detp}$ and the second detecting voltage $V_{detn}$ can remain at the same voltage.

Referring back to FIG. 6, at step S630, the first detecting voltage $V_{detp}$ and the second detecting voltage $V_{detn}$ are compared with the first reference voltage $V_{refp}$ and the second reference voltage $V_{refn}$ at the comparator 570. If the differential voltage $\Delta V$ (i.e, $V_{detp}-V_{detn}$) is larger than the hysteresis level $V_{hys}$ (i.e., $V_{refp}-V_{refn}$), then the comparator 570 sends out the alarm signal $V_{leak}$ at step S640, indicating leakage between WL1 333-1 and WL2 333-2. If the differential voltage $\Delta V$ does not go above the hysteresis level $V_{hys}$, then the comparator 570 sends out another signal at step S650, indicating that there is no leakage between WL1 333-1 and WL2 333-2.

As shown in FIG. 7, a change of the differential voltage $\Delta V$ at the detecting stage depends on the resistance $R_O$ of the simulated resistor 548. In the example in FIG. 7, resistance $R_{O\_3}$ (dashed line) is the smallest and resistance $R_{O\_1}$ (dash-dotted line) is the largest. In the other words, when the leakage between WL1 333-1 and WL2 333-2 is larger, the change of the differential voltage $\Delta V$ is larger. When the differential voltage $\Delta V$ goes above the hysteresis level $V_{hys}$ (shown in dotted line in FIG. 7), the comparator 570 can be triggered to send the alarm signal $V_{leak}$. In this example, the comparator 570 can be triggered when leakage between WL1 333-1 and WL2 333-2 can be represented by the resistance $R_{O\_2}$ or $R_{O\_3}$ of the simulated resistor 548.

Thus, by monitoring the differential voltage $\Delta V$ (i.e, $V_{detp}-V_{detn}$) of the detecting circuit 500, the leakage current between word lines can be detected. The alarm signal $V_{leak}$ can be generated once the differential voltage $\Delta V$ goes above a predetermined value, i.e, the hysteresis level $V_{hys}$ (i.e., $V_{refp}-V_{refn}$) of the comparator 570.

Figure 8:
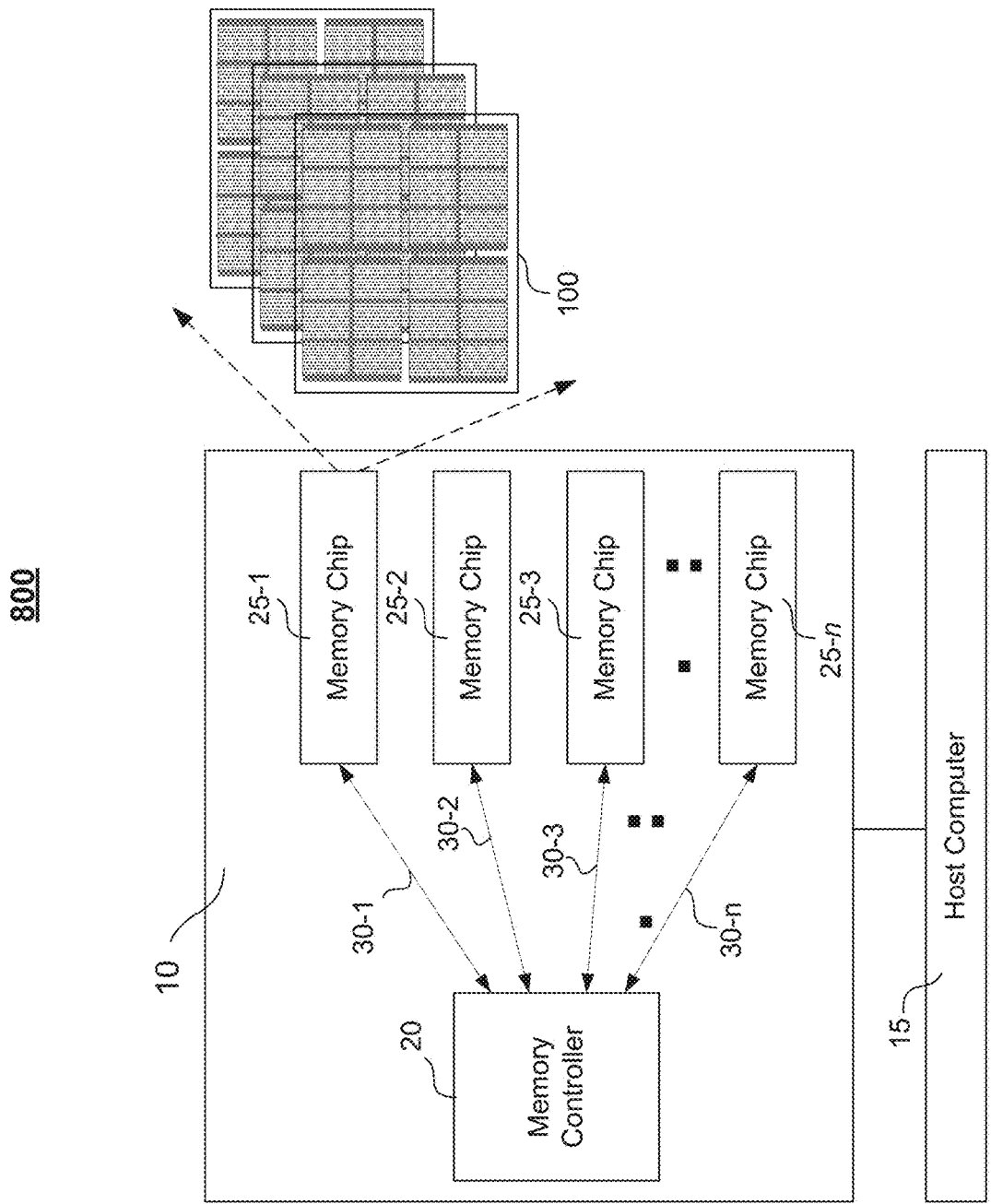
FIGS. 8 and 9A-9B illustrate a storage system with one or more memory chips, according to some embodiments of the present disclosure.

FIG. 8 illustrates a block diagram of an exemplary system 800 having a storage system 10, according to some embodiments of the present disclosure. System 800 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. The storage system 10 (also referred to as a NAND storage system) can include a memory controller 20 and one or more semiconductor memory chips 25-1, 25-2, 25-3, . . . , 25-n. Each semiconductor memory chip 25 (hereafter just "memory chip") can be a NAND chip (i.e., "flash," "NAND flash" or "NAND"). The storage system 10 can communicate with a host computer 15 through the memory controller 20, where the memory controller 20 can be connected to the one or more memory chips 25-1, 25-2, 25-3, . . . , 25-n, via one or more memory channels 30-1, 30-2, 30-3, . . . , 30-n. In some embodiments, each memory chip 25 can be managed by the memory controller 20 via a memory channel 30.

In some embodiments, the host computer 15 can include a processor of an electronic device, such as a central processing unit (CPU), or a system-on-chip (SoC), such as an application processor (AP). The host computer 15 sends data to be stored at the NAND storage system or storage system 10 or retrieves data by reading the storage system 10. The memory controller 20 can handle I/O requests received from the host computer 15, ensure data integrity and efficient storage, and manage the memory chip 25. The memory channels 30 can provide data and control communication between the memory controller 20 and each memory chip 25 via a data bus. The memory controller 20 can select one of the memory chip 25 according to a chip enable signal.

In some embodiments, each memory chip 25 in FIG. 8 can include one or more memory dies 100, where each memory die can be similar to the 3D memory device 100 shown in FIG. 1.

Figure 9A:
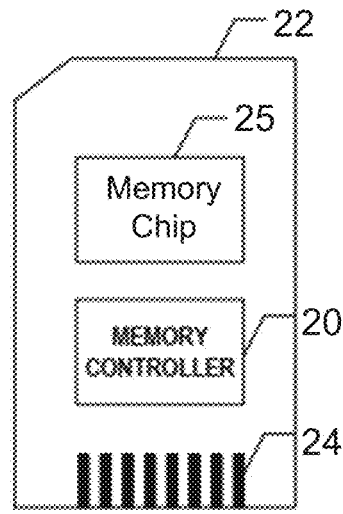
Figure 9B:
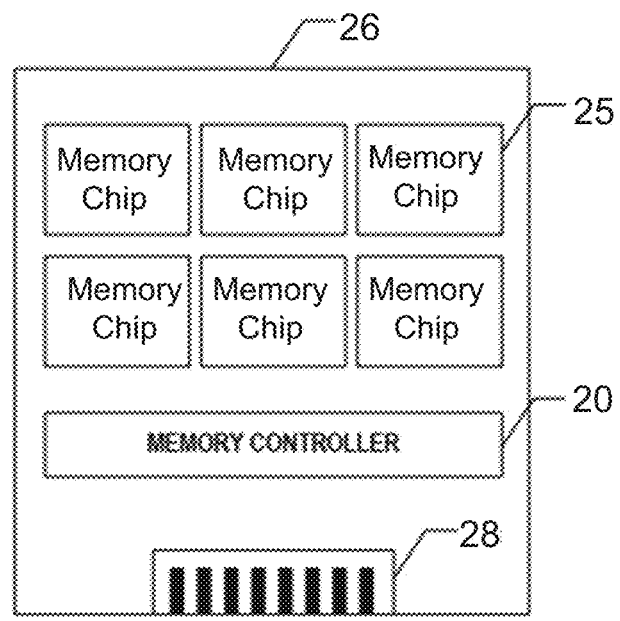

Memory controller 20 and one or more memory chip 25 can be integrated into various types of storage devices, for example, be included in the same package, such as a universal Flash storage (UFS) package or an eMMC package. That is, storage system 10 can be implemented and packaged into different types of end electronic products. In one example as shown in FIG. 9A, memory controller 20 and a single memory chip 25 can be integrated into a memory card 22. Memory card 22 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 22 can further include a memory card connector 24 coupling memory card 22 with a host (e.g., host computer 15 in FIG. 8). In another example as shown in FIG. 9B, memory controller 20 and multiple memory chip 25 can be integrated into an solid state drive (SSD) 26. SSD 26 can further include an SSD connector 28 coupling SSD 26 with a host (e.g., the host computer 15 in FIG. 8).

Figure 10:
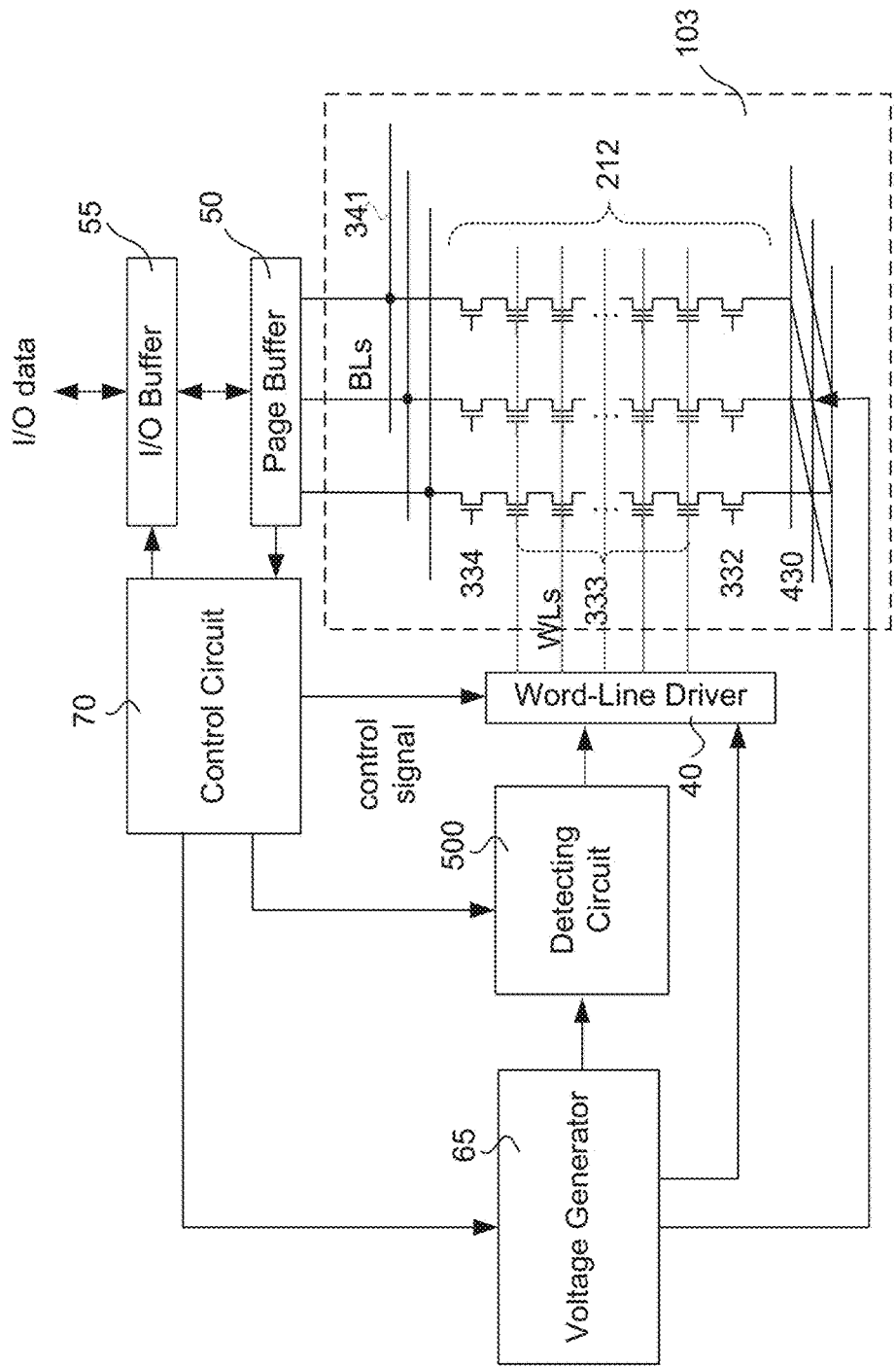
FIG. 10 illustrates a schematic diagram of a memory die, according to some embodiments of the present disclosure.

FIG. 10 illustrates a schematic diagram of the memory die 100, according to some embodiments of the present disclosure. The memory die 100 includes one or more memory blocks 103. A periphery circuit of the memory die 100 includes many digital, analog, and/or mixed-signal circuits to support functions of the memory block 103, for example, a page buffer 50, a word line driver 40, a control circuit 70, a voltage generator 65 and an input/output buffer 55. These circuits can include active and/or passive semiconductor devices, such as transistors, diodes, capacitors, resistors, etc., as would be apparent to a person of ordinary skill in the art.

It is noted that the layout of the electronic components in the storage system 10 and the memory die 100 in FIGS. 8, 9A-B and 10 are shown as examples. The storage system 10 and the memory die 100 can have other layout and can include additional components. For example, the memory die 100 can also have sense amplifier, column decoder, etc. The storage system 10 can also include firmware, data scrambler, etc.

As shown in FIG. 10, the memory block 103 is coupled with the word line driver 40 via word lines (e.g., WLs 333) and/or selection lines (e.g., LSG 332 and TSG 334). The memory block 103 is coupled with the page buffer 50 via bit lines (e.g., BLs 341). The word line driver 40 can select one of the memory blocks 103 on the memory die 100 in response to a control signal provided by the control circuit 70. The word line driver 40 can transfer voltages provided from the voltage generator 65 to the word lines according to the control signal. During the read and program operation, the word line driver 40 can transfer the read voltage $V_{read}$ and program voltage $V_{pgm}$ to the selected word line and the pass voltage $V_{pass}$ to the unselected word lines according to the control signal received from the control circuit 70.

During the program operation, the page buffer 50 can provide an inhibit voltage $V_{inhibit}$ to the unselected bit lines and connect the selected bit line to ground according to I/O data to be programmed. The input/output buffer 55 can transfer the I/O data to the page buffer 50 as well as input addresses or commands to the control circuit 70 or the word-line driver 40.

The control circuit 70 can control the page buffer 50 and the word line driver 40 in response to the commands transferred by the input/output buffer 55. During the program operation, the control circuit 70 can control the word line driver 40 and the page buffer 50 to program a selected memory cell. During the read operation, the control circuit 70 can control the word line driver 40 and the page buffer 50 to read a selected memory cell.

The voltage generator 65 can generate voltages to be supplied to word lines and bit lines under the control of the control circuit 70. The voltages generated by the voltage generator 65 include the program voltage $V_{pgm}$, the pass voltage $V_{pass}$, the inhibit voltage $V_{inhibit}$, etc.

The detecting circuit 500 can be added to the peripheral circuit to detect the leakage between word lines. In some embodiments, the detecting circuit 500 can be connected with the word-line driver 40, the voltage generator 65 and the control circuit 70.

In summary, the present disclosure provides a circuit for detecting leakage between word lines in a memory device. The circuit includes a first coupling capacitor, wherein a first terminal of the first coupling capacitor is connected to a first word line through a first switch, and the first terminal of the first coupling capacitor is also connected to a first voltage supply through a second switch. The circuit also includes a second coupling capacitor, wherein a first terminal of the second coupling capacitor is connected to a second word line through a third switch, and the first terminal of the second coupling capacitor is also connected to a second voltage supply through a fourth switch. The circuit further includes a comparator, wherein a first input of the comparator is connected to a second terminal of the first coupling capacitor and a second input of the comparator is connected to a second terminal of the second coupling capacitor. The comparator is configured to send a signal indicating there is leakage between the first word line and the second word line when a differential voltage between the first input and the second input of the comparator is larger than a hysteresis level of the comparator.

The present disclosure also provides a three-dimensional (3D) memory device. The 3D memory device includes a plurality of memory cells connected to word lines and bit lines configured for addressing each of the plurality of memory cells, wherein the plurality of memory cells are vertically stacked; and a circuit for detecting leakage between word lines. The circuit includes a first coupling capacitor, wherein a first terminal of the first coupling capacitor is connected to a first word line through a first switch, and the first terminal of the first coupling capacitor is also connected to a first voltage supply through a second switch. The circuit also includes a second coupling capacitor, wherein a first terminal of the second coupling capacitor is connected to a second word line through a third switch, and the first terminal of the second coupling capacitor is connected to a second voltage supply through a fourth switch. The circuit further includes a comparator, wherein a first input of the comparator is connected to a second terminal of the first coupling capacitor and a second input of the comparator is connected to a second terminal of the second coupling capacitor, wherein the comparator is configured to send a signal indicating there is leakage between the first word line and the second word line when a differential voltage between the first input and the second input of the comparator is larger than a hysteresis level of the comparator.

The present disclosure also provides a storage system. The storage system includes a memory controller and a three-dimensional (3D) memory device. The 3D memory device includes a plurality of memory cells connected to word lines and bit lines configured for addressing each of the plurality of memory cells, wherein the plurality of memory cells are vertically stacked. The storage system also includes a circuit for detecting leakage between word lines. The circuit includes a first coupling capacitor, wherein a first terminal of the first coupling capacitor is connected to a first word line through a first switch, and the first terminal of the first coupling capacitor is also connected to a first voltage supply through a second switch. The circuit also includes a second coupling capacitor, wherein a first terminal of the second coupling capacitor is connected to a second word line through a third switch, and the first terminal of the second coupling capacitor is connected to a second voltage supply through a fourth switch. The circuit further includes a comparator, wherein a first input of the comparator is connected to a second terminal of the first coupling capacitor and a second input of the comparator is connected to a second terminal of the second coupling capacitor. The comparator is configured to send a signal indicating there is leakage between the first word line and the second word line when a differential voltage between the first input and the second input of the comparator is larger than a hysteresis level of the comparator.

The present disclosure further provides a method for detecting leakage between word lines in a memory device. The method includes pre-charging a detecting circuit and detecting a leakage between a first word line and a second word line. The pre-charging the detecting circuit includes connecting a first terminal of a first coupling capacitor in the detecting circuit to a first voltage supply; and connecting a first terminal of a second coupling capacitor in the detecting circuit to a second voltage supply. The detecting the leakage between the first word line and the second word line includes connecting the first terminal of the first coupling capacitor to the first word line; and connecting the first terminal of the second coupling capacitor to the second word line. The detecting the leakage between the first word line and the second word line further includes comparing a differential voltage at a first input and a second input of a comparator with a hysteresis level of the comparator, wherein the first input of the comparator is connected to a second terminal of the first coupling capacitor; and the second input of the comparator is connected to a second terminal of the second coupling capacitor.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A circuit for detecting leakage between word lines in a memory device, comprising:
   a first coupling capacitor, wherein a first terminal of the first coupling capacitor is connected to a first word line through a first switch, and the first terminal of the first coupling capacitor is also connected to a first voltage supply through a second switch;
   a second coupling capacitor, wherein a first terminal of the second coupling capacitor is connected to a second word line through a third switch, and the first terminal of the second coupling capacitor is also connected to a second voltage supply through a fourth switch; and
   a comparator, wherein a first input of the comparator is connected to a second terminal of the first coupling capacitor and a second input of the comparator is connected to a second terminal of the second coupling capacitor, wherein:
      the comparator is configured to send a signal indicating there is leakage between the first word line and the second word line when a differential voltage between the first input and the second input of the comparator is larger than a hysteresis level of the comparator.

2. The circuit of claim 1, wherein the hysteresis level of the comparator is defined by a difference between a first reference voltage and a second reference voltage of the comparator.

3. The circuit of claim 2, wherein the comparator comprises a hysteresis comparator.

4. The circuit of claim 2, further comprising:
   a resistive voltage divider, wherein a first terminal of the resistive voltage divider is connected to the second terminal of the first coupling capacitor, and a second terminal of the resistive voltage divider is connected to the second terminal of the second coupling capacitor.

5. The circuit of claim 4, wherein the resistive voltage divider comprises a first biasing resistor connected in series with a second biasing resistor.

6. The circuit of claim 5, wherein the resistive voltage divider is configured to provide a common mode reference voltage for the comparator at a connection between the first biasing resistor and the second biasing resistor.

7. The circuit of claim 6, wherein the first reference voltage of the comparator is a sum of the common mode reference voltage and a half of the hysteresis level.

8. The circuit of claim 6, wherein the second reference voltage of the comparator is a difference between the common mode reference voltage and a half of the hysteresis level.

9. The circuit of claim 6, wherein the first biasing resistor and/or the second biasing resistor are adjustable and configured to provide a certain resistance value so as to make the differential voltage at a pre-charge stage equal to about zero, wherein, in the pre-charge stage, the second switch and the fourth switch are turned on for charging the first coupling capacitor and the second coupling capacitor.

10. The circuit of claim 1, wherein the first coupling capacitor and/or the second coupling capacitor are adjustable and configured to provide a certain capacitance value so as to make the differential voltage at a pre-charge stage equal to about zero, wherein, in the pre-charge stage, the second switch and the fourth switch are turned on for charging the first coupling capacitor and the second coupling capacitor.

11. The circuit of claim 1, wherein the memory device is a three-dimensional (3D) NAND Flash memory.

12. A three-dimensional (3D) memory device, comprising:
   a plurality of memory cells connected to word lines and bit lines configured for addressing each of the plurality of memory cells, wherein the plurality of memory cells are vertically stacked; and
   a circuit for detecting leakage between the word lines, comprising:
      a first coupling capacitor, wherein a first terminal of the first coupling capacitor is connected to a first word line through a first switch, and the first terminal of the first coupling capacitor is also connected to a first voltage supply through a second switch;
      a second coupling capacitor, wherein a first terminal of the second coupling capacitor is connected to a second word line through a third switch, and the first terminal of the second coupling capacitor is connected to a second voltage supply through a fourth switch; and
      a comparator, wherein a first input of the comparator is connected to a second terminal of the first coupling capacitor and a second input of the comparator is connected to a second terminal of the second coupling capacitor, wherein:

the comparator is configured to send a signal indicating there is leakage between the first word line and the second word line when a differential voltage between the first input and the second input of the comparator is larger than a hysteresis level of the comparator.

13. The memory device of claim 12, wherein the hysteresis level of the comparator is defined by a difference between a first reference voltage and a second reference voltage of the comparator.

14. The memory device of claim 12, wherein the comparator comprises a hysteresis comparator.

15. The memory device of claim 12, wherein the circuit further comprises:
   a resistive voltage divider, wherein a first terminal of the resistive voltage divider is connected to the second terminal of the first coupling capacitor, and a second terminal of the resistive voltage divider is connected to the second terminal of the second coupling capacitor.

16. The memory device of claim 15, wherein the resistive voltage divider comprises a first biasing resistor connected in series with a second biasing resistor.

17. The memory device of claim 16, wherein the resistive voltage divider is configured to provide a common mode reference voltage for the comparator at a connection between the first biasing resistor and the second biasing resistor.

18. The memory device of claim 17, wherein the first reference voltage of the comparator is a sum of the common mode reference voltage and a half of the hysteresis level.

19. The memory device of claim 17, wherein the second reference voltage of the comparator is a difference between the common mode reference voltage and a half of the hysteresis level.

20. The memory device of claim 12, wherein the 3D memory device is a 3D NAND Flash memory.

* * * * *